United States Patent [19]
Migita et al.

[11] Patent Number: 5,010,517
[45] Date of Patent: Apr. 23, 1991

[54] SEMICONDUCTOR OPTICAL APPARATUS

[75] Inventors: Masahito Migita, Hachioji; Tsuyoshi Uda; Osam Kanehisa, both of Kodaira; Masatoshi Shiiki, Musashimuraya, all of Japan

[73] Assignee: Hitachi, Ltd., Tokyo, Japan

[21] Appl. No.: 271,681

[22] Filed: Nov. 16, 1988

[30] Foreign Application Priority Data

Nov. 18, 1987 [JP] Japan .................................. 62-289322

[51] Int. Cl.$^5$ ............................................ G11C 11/42
[52] U.S. Cl. ...................................... 365/114; 357/16
[58] Field of Search .................. 365/114, 215; 357/16; 355/355

[56] References Cited

U.S. PATENT DOCUMENTS

| | | | |
|---|---|---|---|
| 3,855,583 | 12/1974 | Gudmundsen | 365/114 |
| 4,075,610 | 2/1978 | Crandall et al. | 365/107 |
| 4,101,976 | 7/1978 | Castro et al. | 365/119 |
| 4,103,312 | 7/1978 | Chang et al. | 365/114 X |
| 4,525,687 | 6/1985 | Chemla et al. | 357/16 X |
| 4,546,244 | 10/1985 | Miller | 250/211 J |
| 4,782,223 | 11/1988 | Suzuki | 250/214 R |

FOREIGN PATENT DOCUMENTS

84/03363 8/1984 World Int. Prop. O. .

OTHER PUBLICATIONS

R. H. Miles et al, "Superlattices of II-VI Semiconductors", Journal of Crystal Growth, vol. 85, No. 1-2, Nov. 1987, pp. 188-192.

Allan, Jr. et al, 13th Symposium on GaAs and Related Compounds, Sep. 28, 1986, pp. 339-404.

Peyghambarian, N. et al, "Optical Bistability for Optical Signal Processing and Computing", Optical Engineering, vol. 24, No. 1, Jan. 1985.

Y. Hefetz et al., "Optical Properties of ZnSe/(ZnMN)Se Multiquantum Wells", Applied Physics Letters, vol. 47, No. 9, Nov. 1985, pp. 989-991.

Primary Examiner—Joseph A. Popek
Attorney, Agent, or Firm—Antonelli, Terry, Stout & Kraus

[57] ABSTRACT

A semiconductor optical apparatus of the invention has a quantum well super-lattice structure essentially of only direct transition semiconductor or comprising a direct transition semiconductor and an indirect transiton semiconductor. In the semiconductor optical apparatus of the invention, by using an absorption saturation phenomenon of excitons in the direct transition semiconductor constructing the quantum well super-lattice structure, a non-volatile information recording apparatus which can record, reproduce, and erase information at a high speed even at the room temperature or even by irradiating a light of a low intensity is realized.

33 Claims, 7 Drawing Sheets

FIG. 1A
FIG. 1B
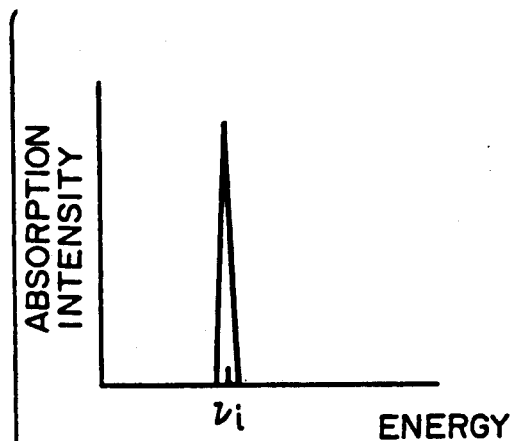
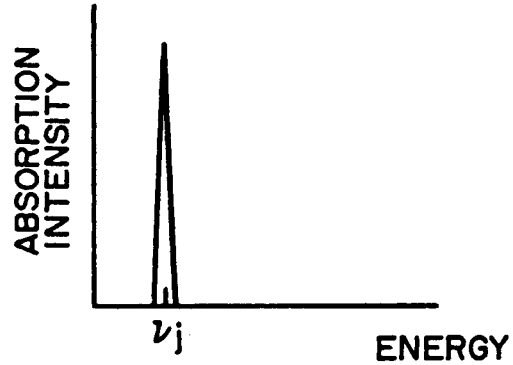
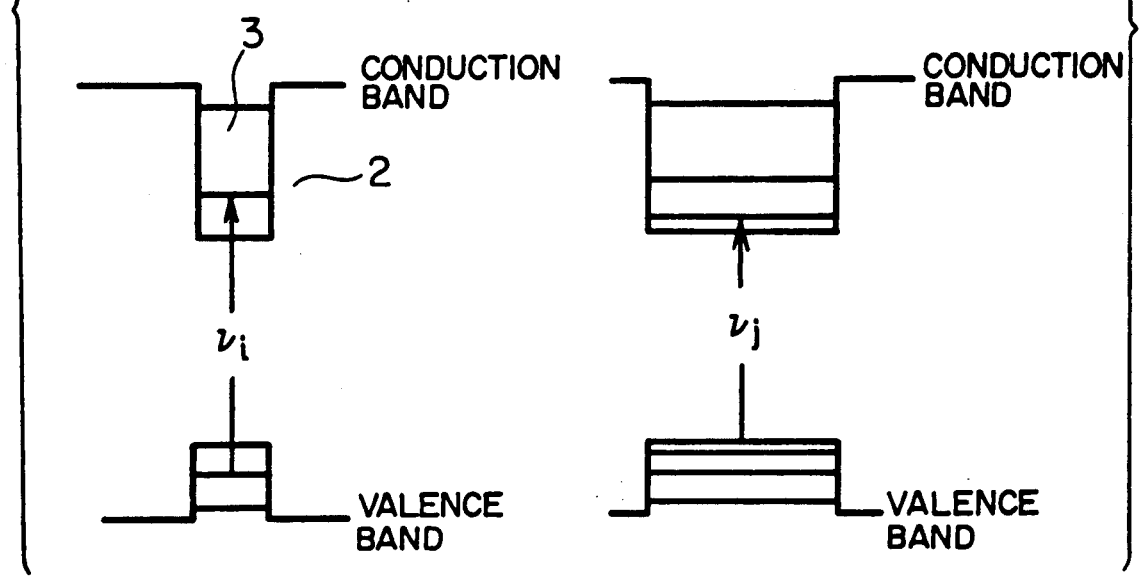

SEMICONDUCTOR OPTICAL APPARATUS

BACKGROUND OF THE INVENTION

The present invention relates to an optical apparatus using an absorption saturation phenomenon of an exciton and, more particularly, to a semiconductor optical apparatus.

Various kinds of apparatus using the absorption saturation phenomenon of an exciton can be considered. In recent years, attention has been paid to the fact that excellent performance is provided by using such an apparatus as an optical recording apparatus. By realizing the absorption saturation phenomenon of an exciton by using a semiconductor super-lattice structure, a rewritable non-volatile information recording apparatus having a high speed and a high density can be realized at room temperatures.

As a method of increasing recording density by using the absorption saturation phenomenon, an optical data recording system using wavelength dimensions has been disclosed in U.S. Pat. No. 4,101,976. According to this conventional system, a bulk material which causes the saturation of a uniform absorption line and shows a heterogeneous absorption line extent is included. Porphyrin, deuterium substituted porphyrin, phthalocyanine tetrazine, and tetraphenyl porphyrin can be mentioned as optical recording materials. Data bits are recorded by using the selective absorption saturation by a narrow band high power laser beam. That is, the above recording uses a phenomenon called an photochemical hole burning (PHB) and relates to a method of causing a narrow width absorption in a special wavelength portion in a wide heterogeneous absorption line. This absorption saturation phenomenon is accomplished in a manner such that ground state molecules of the same kind put under slightly different environments are converted into exciting state molecules in a phase and energy manner by irradiating a laser beam of a special wavelength, thereby finally causing a bleaching of the ground state molecules. Therefore, in principle, the above phenomenon is operable only at super low temperatures of about 20° K. or less and can be caused only by irradiating a laser beam of a high intensity. Therefore, when recording bit information, it has been known that since a high power laser beam of about, e.g., 10 W/$\mu$m$^2$ is irradiated for a period of time of at least 1 msec or longer and the recorded information is rewritten by heating, it takes a time of 5 to 10 minutes to completely erase the recorded information.

As mentioned above, in optical information recording using PHB, the phenomenon at super low temperatures of 20° K. or less, preferably absolute zero, is essentially used; a high laser power is required to write information; and the information is erased or written by heating; so that there is a problem such that the apparatus enlarges in size and becomes complicated.

On the other hand, a recording density of an existing non-volatile memory is relatively so small to be $1 \times 10^6$ to $4 \times 10^6$ bits/cm$^2$. Even in the present large scale computers as well, as super large computers which will be able to be used in the future for AI (artificial intelligence) or the like, a memory having a satisfactory memory capacity does not exist. It is demanded to realize a high performance non-volatile memory.

It is an object of the present invention to solve the problems of the foregoing conventional techniques and to provide an optical recording apparatus to realize super high density non-volatile information recording which can perform high speed recording, reproduction, and erasure even at temperatures near room temperature and even by the light irradiation of a low intensity.

SUMMARY OF THE INVENTION

The present invention intends to realize a high speed and high density non-volatile information recording apparatus which is rewritable at room temperature by using the exciton absorption saturation phenomenon in a semiconductor optical apparatus having a quantum well super-lattice structure.

In the semiconductor optical apparatus of the present invention, the quantum well super-lattice structure is formed by only a direct transition semiconductor or by both of a direct transition semiconductor, and an indirect transition semiconductor and the light which resonates with the absorption wavelength of the exciton absorption line of the direct transition semiconductor is irradiated to the quantum well super-lattice structure of the semiconductor optical apparatus according to the invention, thereby enabling information to be recorded and reproduced at a high speed. Since the semiconductor optical apparatus of the invention has a quantum well super-lattice structure, by controlling a film thickness and compositions of the super-lattice, the exciton absorption phenomenon which occurs only at low temperatures in the case of the bulk can be caused even at room temperature. Information can be recorded and reproduced even at room temperature and even by light of a low intensity. On the other hand, in the semiconductor optical apparatus of the invention, by applying a reverse bias, the recorded information can be easily erased at a high speed. In addition, a recording density of the semiconductor optical apparatus of the invention is about $10^8$ to $10^{10}$ bits/cm$^2$.

As mentioned above, according to the semiconductor optical apparatus of the invention, a memory apparatus which can record, reproduce, and erase information at a high speed and a high density at room temperature is realized.

In accordance with another aspect of the present invention there is provided a semiconductor optical device comprising a semiconductor stacked structure having a first semiconductor layer, a second semiconductor layer and a third semiconductor layer stacked in an above-mentioned order, wherein the semiconductor layers form a quantum well structure therein and an energy band structure thereof has a step-like band structure to electrons in a conduction band and a well band structure at the second semiconductor layer to holes in a valence band.

The above-mentioned semiconductor optical device has a plurality of the semiconductor stacked structures therein and the plurality of the semiconductor stacked structures form a multiple quantum well structure having different well widths so as to absorb light having a plurality of wavelengths in accordance with energies thereof.

In accordance with a further aspect of the present invention there is provided a semiconductor optical device having a semiconductor structure including multiple quantum wells therein, the multiple quantum wells having a plurality of energy states of direct transition and indirect transition of electrons, wherein energy of incident light is absorbed so that electrons are excited through the direct transition, and at least part of the energy is held by the electrons which are in the energy state of the indirect transition. The part of energy is released by shortening a relaxation time of the indirect transition.

BRIEF DESCRIPTION OF THE DRAWINGS

FIGS. 1A and 1B are diagrams showing examples of a quantum well structure and an exciton absorption line;

DESCRIPTION OF THE PREFERRED EMBODIMENTS

Figure 2:
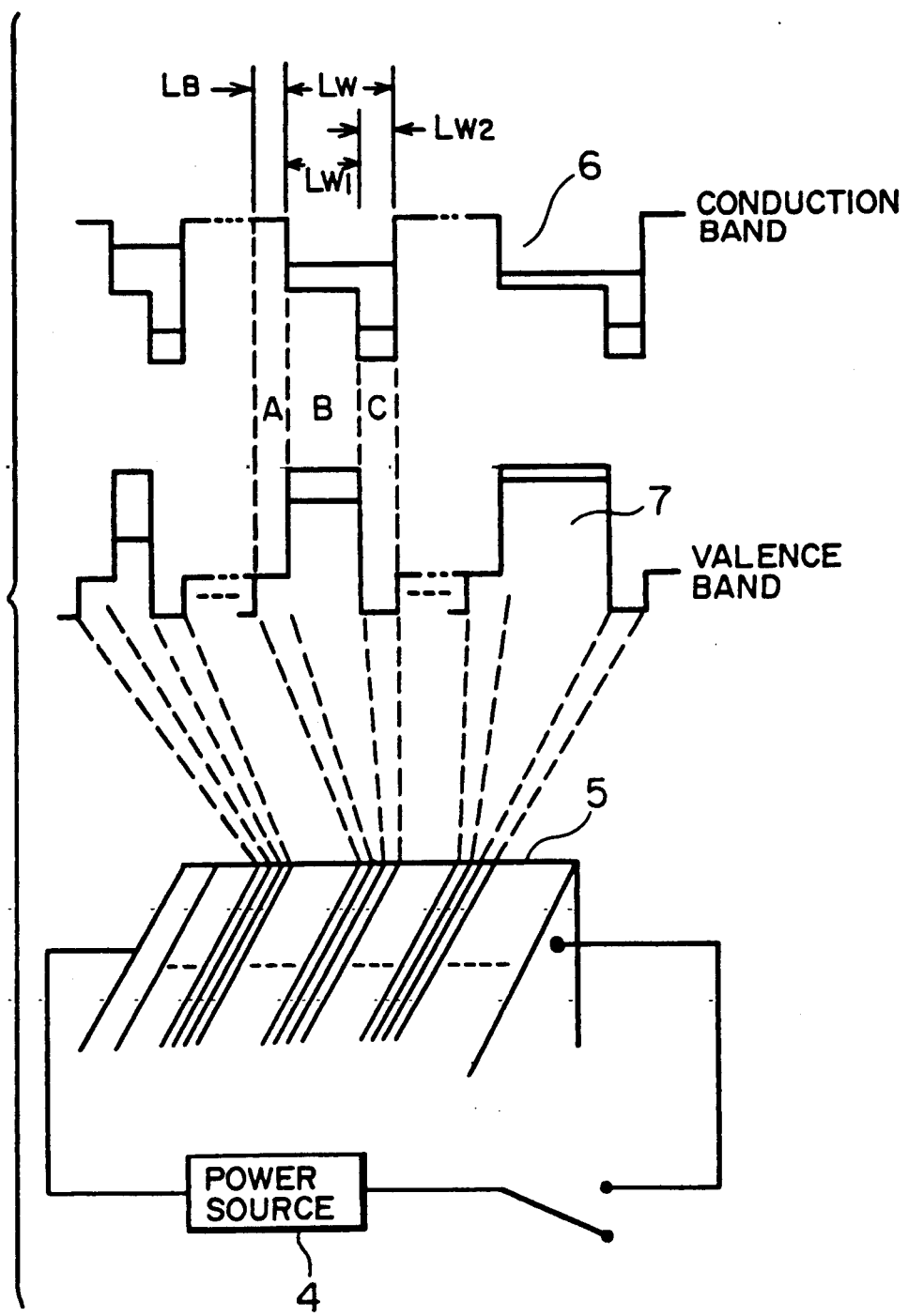
FIG. 2 is a conceptional diagram showing an embodiment of an optical information recording method according to the invention.

An embodiment of the present invention will be described. When explaining the embodiment of the invention, the principle will be first described and practical devices will be subsequently described as Examples 1, 2, and 3.

The invention uses light absorption due to the generation of excitons of a direct transition semiconductor. In the generation of excitons, a steep absorption peak exists at the absorption edge. This is because in the direct transition semiconductor, the bottom of the exciton band is located at a point of zero momentum and the excitons of zero momentum are produced by light irradiation.

As such a semiconductor, there are known compound semiconductors of the II–VI group and III–V group such as ZnSe, ZnS, ZnTe, CdSe, CdS, CdTe, $ZnSe_xS_{1-x}$ ($0<x<1$), $CdSe_xS_{1-x}$ ($0<x<1$), GaAs, InP, InGaAsP, etc.

The absorption peak position by the excitons can be set to an arbitrary wavelength by forming a quantum well super-lattice structure. For instance, in the case of forming a super-lattice structure in which a ZnS layer of 10 nm as shown in FIG. 1 is used as a barrier layer 2 and a quantum well layer of an arbitrary film thickness is used as a light absorption layer 3, as shown in FIGS. 1A and 1B, an energy shift of hundreds of meV occurs between exciton absorption lines 1 when film thicknesses ($L_w$) of quantum well layers are set to 2 nm and 10 nm. Similarly, in the case of forming a super-lattice structure in which $Ga_{0.3}Al_{0.7}As$ of a thickness of 30 nm is used as a barrier layer and a GaAs layer of an arbitrary film thickness is used as a light absorption layer, the exciton absorption line is shifted to the side of a high energy with a decrease in GaAs film thickness. Such control of the absorption peak position can be obviously accomplished by changing the compound semiconductor forming a quantum well or the compositions of the elements constituting the compound semiconductor.

In such a quantum well super-lattice structure, the coupling energy of the excitons increases over that in the bulk. Therefore, the excitons which are unstable in the bulk even at room temperature are free from the thermal dissociation and stably exist, so that the absorption line appears at a position near the band edge. In this manner, in the quantum well super-lattice structure, the intensity of vibrator of the absorption line due to the excitons can be increased by $10^2$ to $10^4$ times. As is also well known from the sum rule of the oscillator strength, such an increase in oscillator strength functions so as to decrease the oscillator strength of the absorption transition between bands which is unpreferable for the semiconductor optical apparatus. On the other hand, in the case where the exciton binding energy is increased by setting the layer thickness $L_w(=L_{w1}+L_{w2})$ of the super-lattice structure shown in, e.g., FIG. 2 to a value of 20 nm or less, the oscillator strength can be concentrated to the transition to the 1s state of the excitons. Accordingly, by making the quantum well super-lattice structure, the exciton absorption line 1 consisting of a steep single absorption transition as shown in FIG. 1 can be made to appear on the lower energy side than the absorption end based on the transition between bands. When irradiating the light of the wavelength which resonates with the absorption wavelength of the excitons which were made appear, as compared with the compound semiconductors of, e.g., ZnSe, GaAs, etc. of the bulk, the absorption coefficient decreases at the incident light intensity which is lower by one digit or more in their super-lattice structures. It is considered that the foregoing phenomenon occurs because in the super-lattice structure, the shielding of the Coulomb interaction of the excitons due to the free electrons-holes is easily caused due to what is called a confinement phenomenon.

Thus, the exciton absorption line can be extinguished in a short time of a few $10^{-12}$ seconds even by the light irradiation of a low intensity of 0.1 to 10 $mW/\mu m^2$, so that the wavelength multiplex optical information recording can be performed. However, such a recording is a volatile recording. The operation regarding the non-volatile recording will now be described hereinbelow.

FIG. 2 shows an example of a band model according to the invention under the field-free condition (E=0). An axis of ordinate indicates an energy and an axis of abscissa indicates a location. A substance A (e.g., a first semiconductor), a substance B (e.g., a second semiconductor), and a substance C (e.g., a third semiconductor) form a heterojunction. The substance A forms a potential barrier for the electrons and holes. The substance B forms a potential barrier for the electrons. The substance C forms a potential barrier for the holes. The substances A, B, and C are approximately intrinsic semiconductors. The free electrons existing in the conduction band of the substance B or C cannot move through the heterojunctions between the substances A and B and between the substances A and C due to the potential barrier formed by the substance A. At the same time, the free holes existing in the valence electron band of the substance B cannot move through the heterojunctions due to the potential barriers formed by the substances A and C. On the other hand, the electrons existing in the conduction band of the substance C cannot move to the left of the heterojunction in the diagram due to the potential barrier formed by the substance B because the lowest energy which the electrons can occupy is smaller than the lowest energy in the substance B. On the other hand, the potential barrier which limits the movement of the carriers has a level of at least KT (about 26 mV), preferably, a few KT, and more desirably, a level of about 10 KT (about 0.26 V) or more.

Since the forbidden band width of the substance B is smaller than those of the substances A and C, excitons are certainly first produced in the substance B by the light of an energy near the forbidden band width of the substance B. The exciton transition between the heterojunctions from the valence electron band of the substance B to the conduction band of the substance C can be ignored because the wave functions of the holes and electrons hardly overlap. The electrons in the conduction band of the substance B are promoted by the Coulomb interaction between the electrons and holes in the excitons and are relaxed to the bottom of a deep quantum well in the substance C. A time of about $10^{-13}$ to $10^{-12}$ seconds or shorter as an atomic vibrating period is required for this relaxation.

Figure 5A:
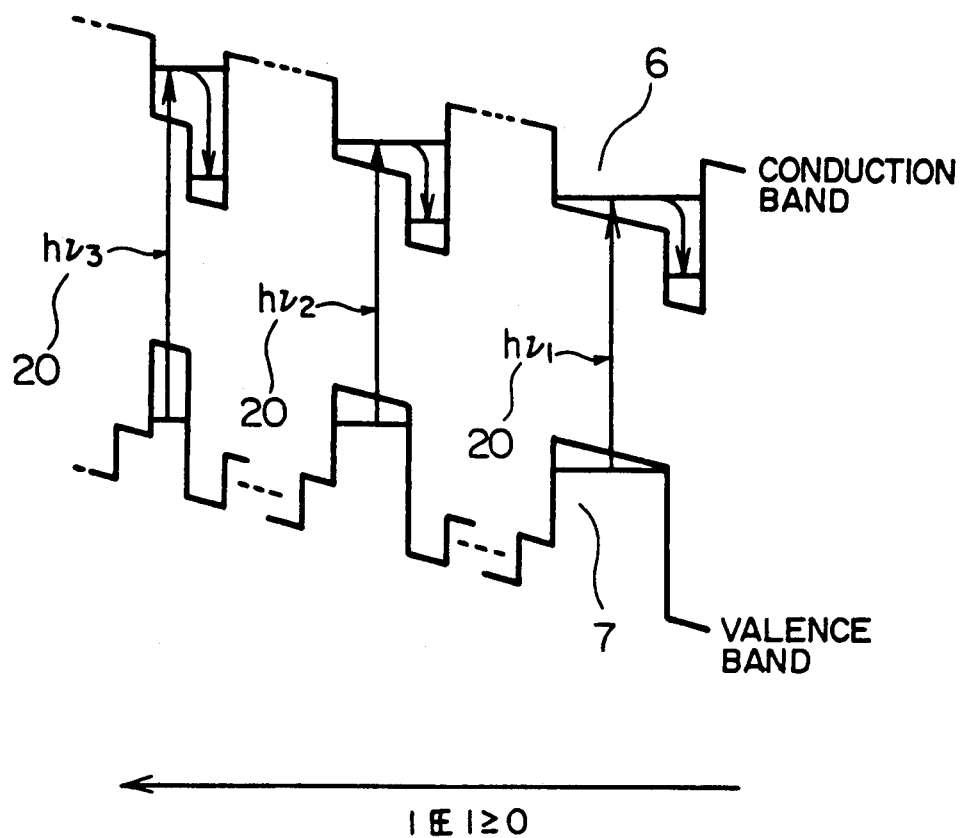
FIGS. 5A and 5B are conceptional diagrams showing an embodiment of the optical information recording method according to the invention.

FIG. 5A shows a band model when a forward bias is applied to the heterojunctions in FIG. 2. That is, the polarity of the substance A is negative for the side of the substance B.

Figure 4A:
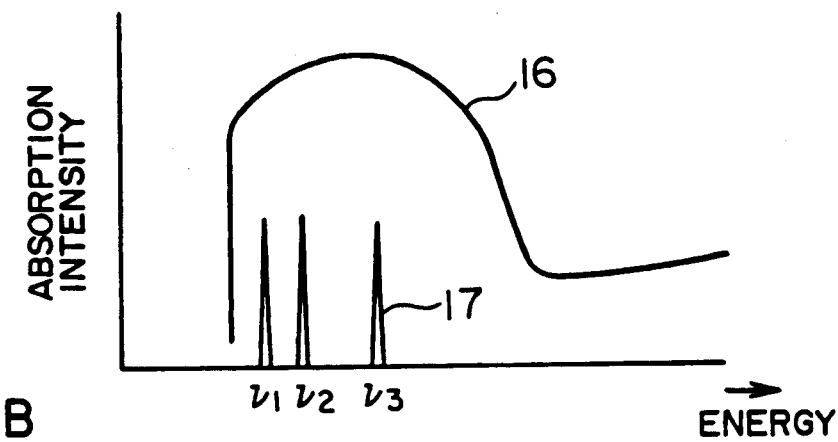
FIGS. 4A to 4C are diagrams showing recording data bits in the embodiment.
Figure 4B:
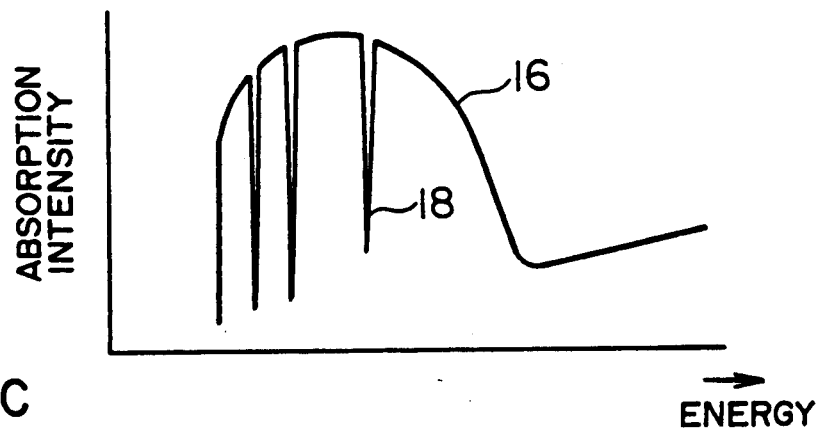

All of the substances A, B, and C are approximately intrinsic and the bending of the band (formation of a depletion layer) due to the sweeping up of the free carriers is so small to be substantially ignored. Therefore, the electric fields which are uniformly generated are shown in the diagram. When electrons are produced in the conduction band of the substance B, the electrons are collected to a portion having a low potential near the heterojunction of the substances C and A due to the function of the electric field. On the other hand, the holes are collected to a portion of a low potential near the heterojunction of the substances B and A. Since the movement of these free carriers results in a drift due to the electric fields, they are moved at an enough high speed. Further, since the wave functions of the electrons and holes are sufficiently separated due to the influence of the electric fields, a transition probability can be extremely suppressed to a low value. Thus, by suppressing the recombination of the electron/hole pairs, the bleaching state can be held for a long period of a few months or longer as shown in FIG. 4B.

The operation regarding the erasure of recorded information will now be described.

Figure 5B:
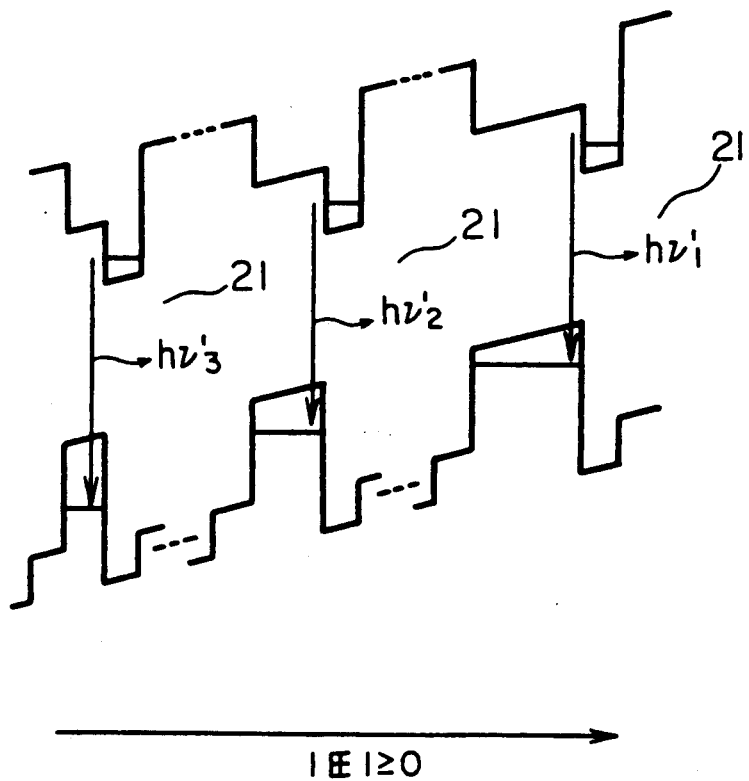

FIG. 5B shows a band model when a reverse bias is applied to the heterojunctions in FIG. 2. That is, the polarity of the substance A becomes positive for the substance B. When the polarity of the applied field is reversed from the state of FIG. 5A to the state of FIG. 5B, both of the electrons and holes are collected to a portion of a low potential near the heterojunction between the substances B and C due to the operation of the electric fields. Further, the wave functions of the electrons and holes exceed the heterojunction and enter the potential barrier due to the influence of the electric fields, so that the wave functions of the electrons and holes overlap. Therefore, since the transition probability increases, the recombining process of the electrons and holes can be promoted. Thus, information can be erased at a high speed.

Figure 4C:
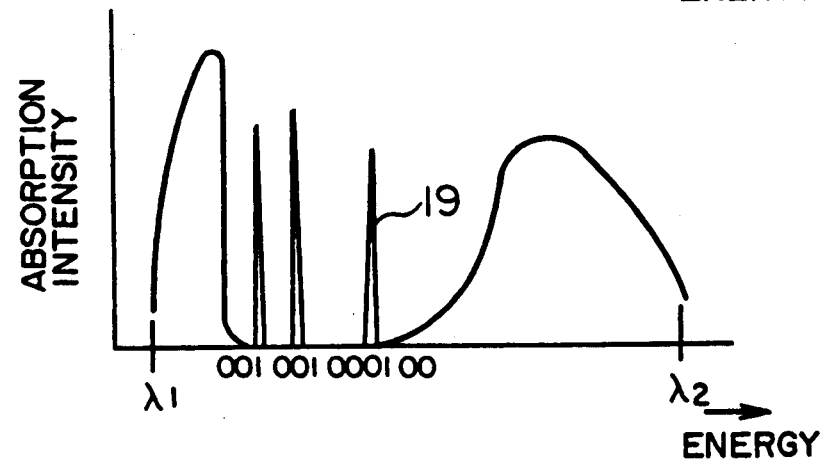

A method of optically recording information by the non-volatile wavelength selection which is constructed by the writing, recording/holding, and erasing operations will now be described with reference to FIGS. 4 and 5. n layers of sets of the super-lattice layers each having a quantum well structure shown in FIG. 2 which makes appear exciton absorption lines having different absorption peak wavelengths and narrow half-value widths are laminated. That is, information recording layers of n bits are formed. At this time, one bit denotes binary logic information in which the presence and absence of the exciton absorption line correspond to 0 and 1. The light absorbing section consisting of the set of super-lattice layers is sandwiched by insulative films which are transparent to the recording light. Further, both sides of this assembly are sandwiched by transparent electrodes 22 and a forward bias of, typically, 0 to $10^6$ V/cm is applied between the electrodes. Thereafter, the absorption saturation of the excitons is caused in each of super-lattice layers i, j, and k having absorption bands at wavelengths $\nu_1$, $\nu_2$, and $\nu_3$ by the laser beams of the wavelengths $\nu_1$, $\nu_2$, and $\nu_3$ which are generated from a laser beam source 17 at room temperature, so that information is recorded. The recording holding period of time is a few months or longer. After that, a probe beam of an enough weak intensity having a wavelength width wider than $\Delta\lambda = \lambda_2 - \lambda_1$ in FIG. 4C is irradiated, thereby measuring the absorption spectrum. As shown in FIG. 4C, for the spectrum to be measured, the absorption saturation wavelength is made correspond to a binary logic "1" and the wavelength at which the exciton absorption line exists is made correspond to binary logic "0". In this case, for instance, the reproduction of information (001001000100)
 i   j   k is accomplished. Thereafter, when a reverse bias of about 0 to $16^6$ V/cm is applied between the electrodes, the exciton absorption line is recovered and the erasure of the information is accomplished. In this manner, for instance, in the semiconductor optical apparatus, information is completely written for a time of 2 msec by an energy of 20 mW. Thereafter, the information can be read out ten thousand times or more for a few months or longer. The recording density at this time is about at most $10^{10}$ bits/cm$^2$. This recording density value is larger by three order of magnitude than the maximum recording density in the existing apparatus. The information can be read out without using the probe light. In this case, as shown in FIG. 5B, a reverse bias is applied and a light emitting line is used. The light emitting line indicates the information which corresponds to the recorded information in a one-to-one corresponding relation by the light emitting signals in accordance with the difference of the quantum level of the quantum well for the holes which is provided in the valence electron band. In this case, the number of reading operation times differs depending on the intensity of the reverse bias to be applied and the information can be read out at most ten times.

The operations to record, store/hold, reproduce, and erase information in the semiconductor optical apparatus of the invention have been described above on the basis of the band diagrams of the quantum well super-lattice structure.

Figure 7:
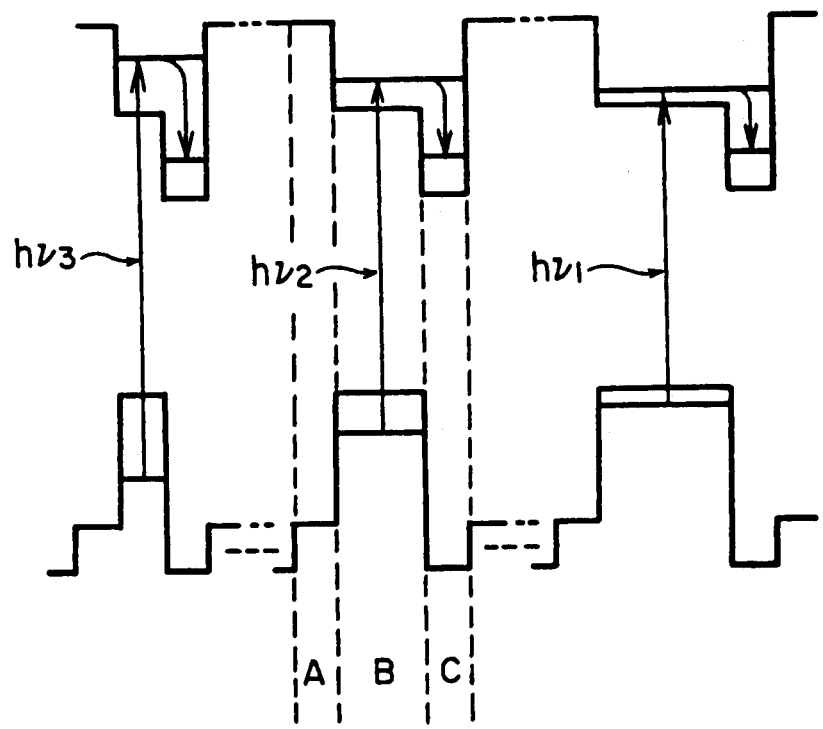
FIG. 7 is a conceptional diagram showing another embodiment of an optical information recording method according to the invention.

Another embodiment of a semiconductor optical apparatus of the invention will now be described. FIG. 7 is a conceptional diagram showing another embodiment of a semiconductor optical apparatus of the invention. In the semiconductor optical apparatus in FIG. 7, the substance B is constructed by a direct transition semiconductor and the substance C is constructed by an indirect transition semiconductor. In the semiconductor optical apparatus in FIG. 7, information is recorded by the exciton transition in the substance B by the light of an energy near the forbidden band width of the substance B in a manner similar to the foregoing semiconductor optical apparatus of the invention. The electrons excited in the conduction band of the substance B are promoted by the Coulomb interaction between the electrons and the holes in the excitons and are relaxed to the bottom of the deep quantum well in the substance C. The substance C is constructed by the indirect transition semiconductor. In the indirect transition semiconductor, the recombination of the electrons and holes is suppressed and the stored information is held for a long period of time even under the field-free condition. In the semiconductor optical apparatus of FIG. 7, the stored information can be also erased by applying a reverse bias as shown in FIG. 5B.

As the means for forming the super-lattice structure, a molecular beam (MBE) method, an organometallic molecular beam (MOMBE) method, an organometallic chemical vapor deposition (MOCVD) method, an atomic layer epitaxy (ALE) method, and the like have been known.

A II-VI group compound and a III-V group compound have been known as the substances which form the heterojunction to cause the quantum wells for the electrons and holes at different positions. For instance, the substance A is $ZnS_xSe_{1-x}$ ($0 \leq x \leq 1$), the substance B is CdTe, and the substance C is CdS. Or, the substance A is $ZnS_xSe_{1-x}$ ($0 \leq x \leq 1$), the substance B is GaAs, and the substance C is CdS, etc. The electric field intensity is set to a value enough to perform a desired function and, typically, it is set to 0 to $10^6$ V/cm.

Figure 6A:
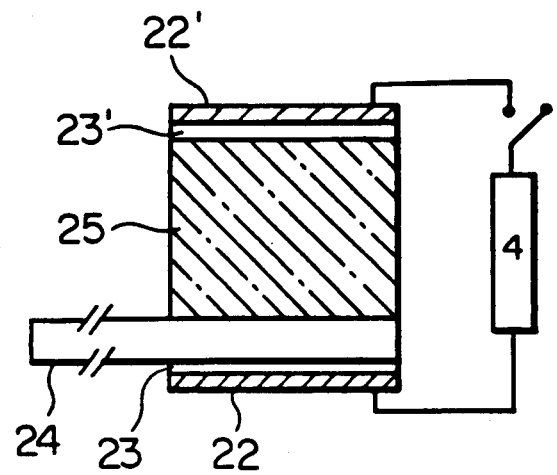
FIG. 6A is a conceptional diagram regarding a device structure showing an embodiment of the invention.
Figure 6B:
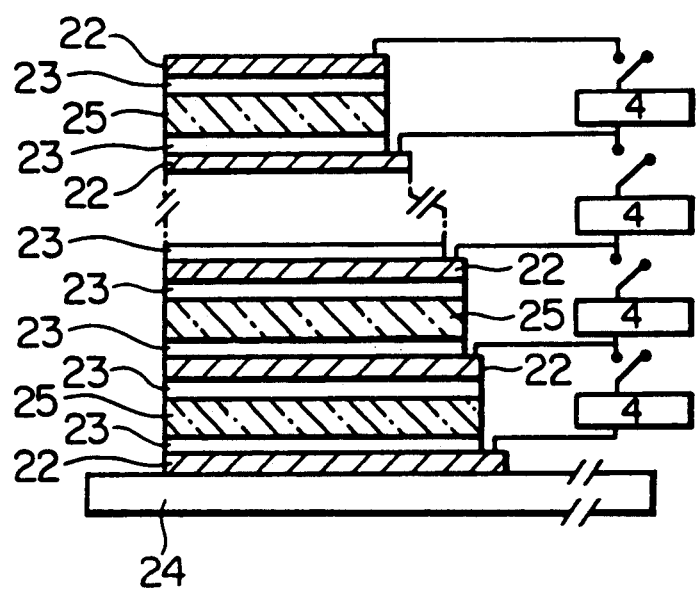
FIG. 6B is a conceptional diagram regarding a device structure showing another embodiment of the invention.

FIGS. 6A and 6B show examples of a device structure. In FIG. 6A, after the transparent electrode 22 and an insulative substance 23 were laminated on a substrate 24, a heterojunction consisting of the substances A, B, and C is formed on the opposite surface of the substrate 24. Finally, a transparent electrode 22' is again formed through the insulative substance 23. The electrode 22 is made of indium-tin oxide (ITO), thin film gold, or the like to transmit a desired light. Similarly to the substance A, a II-VI group semiconductor of the wide band gap can be also used as the insulative substance. Or, the substances such as $Al_xGa_{1-x}As$ ($0 < x \leq 1$), $CaF_2$, $BaF_2$, etc., or the substance such as $SiO_2$, $Ta_2O_5$, etc. can be also used. On the other hand, similarly to the substance A, the substrate can be made of a II-VI group semiconductor of the wide band gap or the substance such as $CaF_2$, $BaF_2$, etc. In the example of the device shown in FIG. 6B having a structure such that an optical information recording layer is sandwiched by the insulative layer and electrode every absorption layer which indicates the same exciton absorption line, a voltage can be independently applied every layer constituting each bit. Therefore, the recorded information can be corrected by erasing and rerecording information every bit.

Examples of practical devices will now be described in detail as embodiments of the invention with reference to the drawings.

EXAMPLE 1

In FIG. 6A, the ZnS monocrystalline substrate ($0.5 \times 10 \times 10$ mm$^3$) 24 was formed by evaporation depositing the transparent electrode 22 and $Ta_2O_5$ insulative layer 23 of a film thickness of 400 nm onto one surface. A ZnS layer of a film thickness of 10 nm, CdTe of a film thickness of $L_{w1}$, and CdS of a film thickness of $L_{w2}$ were repetitively laminated onto the (111) face of the substrate 24 in accordance with this order by the MOCVD (organometallic chemical vapor deposition) method, MBE method, or the like to thereby obtain a recording layer 25. The number of data bits is set to n=12. First, in the first layer (n=1) of the recording layer 25, the thickness $L_{w1}$ of the CdTe light absorption layer was set to 13 nm, the thickness $L_{w2}$ of the CdS layer was set to 3 nm, and a combination of three layers consisting of ZnS (10 nm), CdTe (13 nm), and CdS (3 nm) was formed. Twenty sets of these combined layers are laminated to thereby form the first layer corresponding to one data bit having a total film thickness of 520 nm. The film thickness of the ZnS layer was set to a predetermined value of 10 nm. The film thickness of CdS was set to a predetermined value of 3 nm ($=L_{w2}$), and the second to twelfth layers were formed. For the second layer, the thickness $L_{w1}$ of the CdTe light absorption layer was set to 12 nm and a set of combination consisting of ZnS (10 nm), CdTe (12 nm), and CdS (3 nm) was formed. Twenty sets of these combined layers were laminated such that the film thickness of the CdTe light absorption layer is set to about 260 nm. In this manner, the second layer corresponding to the second data bit was formed. In a manner similar to the above, the CdTe layer was reduced by a thickness of 1 nm at a time and the third to twelfth layers consisting of the super-lattice structure shown in FIG. 2 were formed. The total film thickness of the CdTe light absorption layer in each layer is set to about 260 nm. Therefore, for instance, the twelfth layer becomes the super-lattice film of a film thickness of 1.95 $\mu$m in which 130 layers consisting of ZnS (10 nm), CdTe (2 nm), and CdS (3 nm) were laminated. After the twelfth layer was formed, the ZnS layer of a film thickness of 100 nm is laminated. Then, the $Ta_2O_5$ insulative layer 23 of a film thickness of 400 nm was laminated. The transparent electrode 22' was formed on the insulative layer 23. Both sides of the electrode were connected to a power source 4 which can apply an arbitrary electric field of 0 to $10^6$ V/cm to the optical information recording layer 25 and has a switching circuit to switch both of forward and reverse biases. The material manufactured in this manner is used as an optical recording device 5.

Figure 3B:
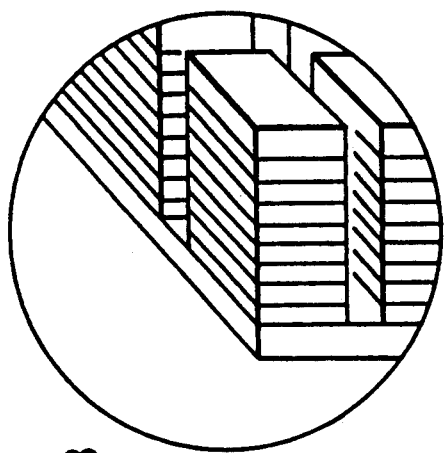
FIG. 3 is a conceptional diagram showing the optical information recording system according to the invention.
Figure 3A:
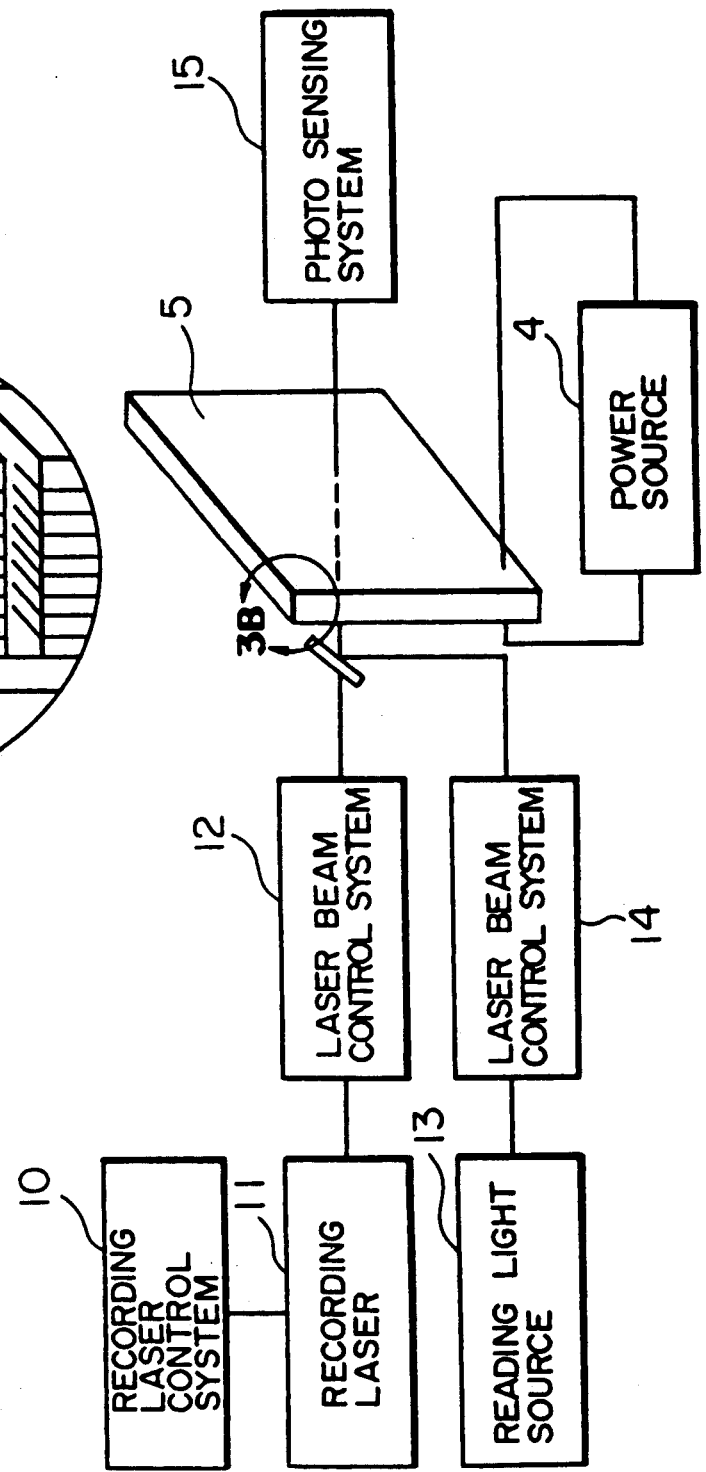

In FIG. 3, reference numeral 11 denotes a recording laser beam source which is controlled by a laser control system 10. A laser beam emitted from the laser beam source 11 is controlled by a laser beam control system 12 and is irradiated onto the optical recording device 5. A size of irradiation light spot is set to about 1 $\mu$m. A plurality of GaAs MQW semiconductor lasers are used as the laser beam source 11. Three kinds of laser beams in which half-value widths of the semiconductor lasers are 0.5 meV or less, outputs are 50 mW, and wavelengths are 808.21 nm (1.533 eV, $\nu_1$), 806.12 nm (1.537 eV, $\nu_2$), and 802.96 nm (1.543 eV, $\nu_3$) were simultaneously irradiated for a period of time of 2 msec, thereby recording information. FIG. 4B shows an absorption spectrum of the optical recording device after the information was recorded. Next, the information is read out through an optical path control system 14 by a recording reading light 13 of an output of 10 μW consisting of a wide spectrum of wavelengths in a range from 770 nm ($\lambda_1$) to 920 nm ($\lambda_2$) and is output by a data reading system 15. The result is shown in FIG. 4C. The recording density of the recording device was $7.2 \times 10^9$ bits/cm$^2$. After data was recorded, the recorded data can be held even after the lapse of two years.

This recording device can also operate even under the field-free condition. The recording holding time in this case is at least a few weeks.

EXAMPLE 2

In FIG. 6A, the ZnSe monocrystalline substrate ($0.5 \times 10 \times 10$ mm$^3$) 24 was formed by laminating the transparent electrode 22 and Ta$_2$O$_5$ insulative layer 23 of a film thickness of 400 nm onto one surface. The recording layer 25 was formed by repetitively laminating the ZnSe layer of a film thickness of 10 nm, GaAs of a film thickness of $L_{w1}$, and CdS of a film thickness of $L_{w2}$ onto the (111) face of the substrate 24 in accordance with this order by the well-known method such as MOCVD method or MBE method. The number of data bits is set to n=12. In the first layer (n=1) of the recording layer 25, a thickness of the GaAs light absorption layer was set to $L_{w1}=13$ nm, a thickness of CdS layer was set to $L_{w2}=3$ nm, and a set of combination consisting of three layers of ZnS (10 nm), GaAs (13 nm), and CdS (3 nm) was formed. Five sets of these combined layers were laminated to thereby form the first layer corresponding to one data bit having a total film thickness of 130 nm. In a manner similar to the above, a film thickness of the ZnS layer was set to a predetermined value of 10 nm and a film thickness of the CdS layer was set to a predetermined value of 3 nm ($L_{w2}$), and the second to twelfth layers were formed. For the second layer, a thickness of the GaAs light absorption layer was set to $L_{w1}=12$ nm and a set of combination consisting of ZnS (10 nm), GaAs (12 nm), and CdS (3 nm) was formed. Six sets of these combined layers were laminated to thereby form the second layer to record the second data bit so that a thickness of the GaAs layer is set to about 65 nm. In a manner similar to the above, the GaAs layer was reduced by 1 nm at a time and the third to twelfth layers consisting of the super-lattice structure shown in FIG. 2 were formed. For instance, the twelfth layer becomes a film consisting of the super-lattice structure of a film thickness of about 560 nm in which 33 layers consisting of ZnS (10 nm), GaAs (2 nm), and CdS (3 nm) were laminated. After the twelfth layer was formed, the ZnS layer of a thickness of 100 nm is laminated. The Ta$_2$O$_5$ insulative layer 23 of a film thickness of 400 nm was then laminated on the ZnS layer. The transparent electrode 22 was formed on the insulative layer 23. Both sides of the electrode 22 were connected to the power source 4. Thus, arbitrary electric fields of both of the forward and reverse biases of 0 to 10$^6$ V/cm can be applied to the information recording layer 21. The material manufactured in this manner is used as the optical recording device 5. Next, a plurality of GaAs MQW semiconductor lasers for emitting the lights of different oscillating wavelengths were used as the recording light source. Two kinds of laser beams in which half-value widths of the lasers are 0.5 meV or less, an output is 10 mW, and wavelengths are 837.16 nm (1.480 eV, $\nu_1$) and 831.54 nm (1.490 eV, $\nu_2$) were simultaneously irradiated for a period of time of 1 msec, thereby recording information. Next, the recorded information is read out by irradiating the reading light 13 of an output of 10 μW consisting of a broad spectrum of wavelengths within a range from 830 nm ($\lambda_1$) to 890 nm ($\mu_2$). The data recording density was about 10$^9$ bits/cm$^2$. The data can be also read out even after the lapse of two years. Even if the recording device is operated under the field-free condition, the good recording and reproducing characteristics are obtained. The recording holding time in this case was two weeks.

EXAMPLE 3

In FIG. 6A, the ZnS monocrystalline substrate ($0.5 \times 10 \times 10$ mm$^3$) 24 was formed by evaporation depositing the transparent electrode 22 and Ta$_2$O$_5$ insulative layer 23 of a film thickness of 400 nm onto one surface. The recording layer 25 was formed by repetitively laminating the ZnS layer of a film thickness of 10 nm, GaAs of a film thickness of $L_{w1}$, and GaP of a film thickness of $L_{w2}$ onto the (111) face of the substrate 24 in accordance with this order by the MOCVD (organometallic chemical vapor deposition) method, MBE method, or the like. The number of data bits is set to n=12. First, in the first layer (n=1) of the recording layer 25, a thickness of the GaAs light absorption layer was set to $L_{w1}=13$ nm, a thickness of the CdS layer was set to $L_{w2}=3$ nm, and a set of combination consisting of three layers of ZnS (10 nm), GaAs (13 nm), and GaP (3 nm) was formed. Twenty sets of these combined layers were laminated, thereby forming the first layer corresponding to one data bit having a total film thickness of 520 nm. In a manner similar to the above, a film thickness of the ZnS layer was set to a predetermined value of 10 nm and a film thickness of the Gap was set to a predetermined value of 3 nm ($=L_{w2}$), and the second to twelfth layers were formed. For the second layer, a thickness of the GaAs light absorption layer was set to $L_{w1}=12$ nm and a set of combination consisting of ZnS (10 nm), GaAs (12 nm), and GaP (3 nm) was formed. 22 sets of these combined layers were laminated to thereby form the second layer corresponding to the second data bit such that a film thickness of the CdTe light absorption layer is set to about 260 nm. In a manner similar to the above, the GaAs layer was reduced by a thickness of 1 nm at a time and the third to twelfth layers consisting of the super-lattice structure shown in FIG. 2 were formed. A total film thickness of the CdTe light absorption layer in each layer was set to about 260 nm. Therefore, for example, the twelfth layer becomes the super-lattice film of a film thickness of 1.95 μm in which 130 layers consisting of ZnS (10 nm), GaAs (2 nm), and GaP (3 nm) were laminated. After the twelfth layer was formed, the ZnS layer of a film thickness of 100 nm is laminated. The Ta$_2$O$_5$ insulative layer 23 of a film thickness of 400 nm was then laminated onto the ZnS layer. The transparent electrode 22' was formed on the insulative layer 23. Both sides of the electrode are connected to the power source 4 which can apply an arbitrary electric field of 0 to 10$^6$ V/cm to the optical information recording layer 25 and has a switching circuit to switch both of forward and reverse biases. The material manufactured in this manner is used as the optical recording device 5.

In FIG. 3, reference numeral 11 denotes the recording laser beam source which is controlled by the laser control system 10. A laser beam emitted from the laser beam source 11 is controlled by the laser beam control system 12 and is irradiated onto the optical recording device 5. A size of irradiation light spot is set to about 1 μm. A plurality of GaAs MQW semiconductor lasers are used as the laser beam source 11. Three kinds of laser beams in which half-value widths of the semiconductor lasers are 0.5 meV or less, outputs are 50 mW, and wavelengths are 866.36 nm (1.430 eV, $\nu_1$), 863.95 nm (1.434 eV, $\nu_2$), and 861.54 nm (1.438 eV, $\nu_3$) were simultaneously irradiated for a period of time of 2 msec, thereby recording information. FIG. 4B shows an absorption spectrum of the optical recording device after the information was recorded. Next, the recorded information is read out through the optical path control system 14 by the recording reading light 13 of an output of 10 μW consisting of a wide spectrum of wavelengths within a range from 800 nm ($\lambda_1$) to 940 nm ($\lambda_2$) and is output by the data reading system 15. The result is shown in FIG. 4C. The recording density of the recording device was $7.2 \times 10^9$ bits/cm$^2$.

The recording holding time under the field-free condition was a few months and the performance of $10^4$ V/cm was held for one year or longer under the field applying condition.

According to the semiconductor optical apparatus having the quantum well structure of the invention, even at temperatures near room temperature or even when a laser beam of a low intensity is irradiated, the high density and non-volatile information recording which can record, reproduce, and erase information at a high speed can be performed. The recording density of about $10^8$ to $10^{10}$ bits/cm$^2$ can be realized.

Although the semiconductor optical apparatus of the invention has the excellent performance as an information recording apparatus as mentioned above, it can be also used as a wavelength converting device or an input/output switching device.

We claim:

1. A semiconductor optical device comprising a quantum well super-lattice structure for recording information by receiving light, said structure including a direct transition semiconductor as a component thereof, wherein energy of the light is received in an exciton absorption state of the direct transition semiconductor, and wherein said quantum well super-lattice structure includes a multi-quantum well super-lattice structure (MQW) in which a set of quantum well super-lattice structures are laminated.

2. The device as set forth in claim 1 wherein the super-lattice structure has a plurality of exciton absorption states so that lights having a plurality of wavelengths are received in the exciton absorption states in accordance with energies thereof.

3. A device according to claim 1, wherein said quantum well super-lattice structure includes a heterojunction by first, second, and third semiconductors having different band gaps.

4. A device according to claim 3, wherein said quantum well super-lattice structure has a stairway-like band structure in which energies for electrons in a conduction band sequentially decrease from one side of said heterojunction to the other side thereof in accordance with the order of said first, second, and third semiconductors, the energy for holes in a valence electron band becomes minimum in the second semiconductor, and the band gap of the second semiconductor is smaller than the band gaps of the first and third semiconductors.

5. A device according to claim 4, wherein information is written by an exciton absorption phenomenon of said second semiconductor, and by applying an electric field in such a direction that the first semiconductor is set to be negative and the third semiconductor is set to be positive, the stored information is held.

6. A device according to claim 4, wherein information is written by an exciton absorption phenomenon of the second semiconductor, and by applying an electric field in such a direction that the first semiconductor is set to be positive and the third semiconductor is set to be negative, the stored information is erased.

7. A device according to claim 3, wherein said first, second, and third semiconductors are laminated in accordance with this order, the first semiconductor constructs a potential barrier for electrons and holes, the second semiconductor constructs a potential barrier for electrons, and the third semiconductor constructs a potential barrier for holes, respectively.

8. A device according to claim 7, wherein a potential value of said potential barrier is at least 1 KT (about 26 mV).

9. A device according to claim 7, wherein a potential value of said potential barrier is at least about 5 KT (about 0.13 V).

10. A device according to claim 7, wherein a potential value of said potential barrier is at least about 10 KT (about 0.26 V).

11. A device according to claim 3, wherein said first semiconductor is ZnS, said second semiconductor is CdTe, and said third semiconductor is CdS.

12. A device according to claim 3, wherein said first semiconductor is ZnS, said second semiconductor is GaAs, and said third semiconductor is CdS.

13. A device according to claim 3, wherein said first semiconductor is ZnS, said second semiconductor is GaAs, and said third semiconductor is GaP.

14. A device according to claim 1, wherein recording is performed by confining electrons and holes into said quantum well super-lattice structure which is defined by conduction-band offsets and valence-band offsets, and defined by layer thicknesses of said direct transition semiconductor other the semiconductor layers of which said quantum well super-lattice structure is made.

15. A device according to claim 3, wherein said quantum well super-lattice structure comprises said direct transition semiconductor and an indirect transition semiconductor.

16. A device according to claim 15, wherein a writing operation is performed by an exciton absorption in the direct transition semiconductor and a recording holding operation is performed in the indirect transition semiconductor.

17. A semiconductor optical device comprising a semiconductor stacked structure having a first semiconductor layer, a second semiconductor layer and a third semiconductor layer stacked in an above-mentioned order, wherein said first, second and third semiconductor layers form a quantum well structure therein and an energy band structure thereof has a step-like band structure to electrons in a conduction band and a well band structure at said second semiconductor layer to holes in a valence band.

18. A device as set forth in claim 17 wherein a plurality of the semiconductor stacked structures are provided therein and said plurality of the semiconductor stacked structures form a multiple quantum well structure having different well widths so as to absorb light having a plurality of wavelengths in accordance with energies thereof.

19. A semiconductor optical device having a semiconductor structure including multiple quantum wells therein, said multiple quantum wells having a plurality of energy states of direct transition and indirect transition of electrons, wherein energy of incident light is absorbed so that electrons are excited through the direct transition, and at least part of the energy is held by the electrons which are in the energy state of the indirect transition.

20. A device as set forth in claim 19 wherein said at least part of energy is released by shortening relaxation time of the indirect transition.

21. A semiconductor optical device comprising a quantum well super-lattice structure, said quantum well super-lattice structure comprising:
   generation means for generating pairs of a hole and an electron through exciton absorption phenomena by receiving light; and
   confining means for confining the holes and the electrons to potential wells formed in said quantum well super-lattice structure, wherein said quantum well super-lattice structure is formed of a direct transition semiconductor and at least one member selected from the group consisting of a direct transition semiconductor and an indirect transition semiconductor.

22. A semiconductor optical device according to claim 2, wherein the generation means includes means for generating pairs of a hole and an electron through exciton absorption phenomena by receiving light having a plurality of wavelengths.

23. A semiconductor optical device according to claim 21, wherein said quantum well super-lattice structure consists essentially of direct transition semiconductors.

24. A semiconductor optical device according to claim 23, wherein said confining means include means for applying a forward electric field to said quantum well super-lattice structure.

25. A semiconductor optical device according to claim 23, further comprising means for applying light to said quantum well super-lattice structure and means for applying a forward electric field to said quantum well super-lattice structure to record and retain information.

26. A semiconductor optical device according to claim 25, further comprising means for applying a reverse electric field to said quantum well super-lattice structure to thereby erase recorded information.

27. A semiconductor optical device according to claim 21, further comprising means for applying light to said quantum well super-lattice structure and means for applying a forward electric field to said quantum well super-lattice structure to record information.

28. A semiconductor optical device according to claim 27, further comprising means for applying a reverse electric field to said quantum well super-lattice structure to erase recorded information.

29. A semiconductor optical device according to claim 21, further comprising:
   means for applying light to said quantum well super-lattice structure to record information;
   second means for applying light to said quantum well super-lattice structure to read said information; and
   photo-sensing means for reading said recorded information by using said light applied by said second means.

30. A semiconductor optical device comprising a quantum well super-lattice structure, said quantum well super-lattice structure comprising:
   generation means for generating pairs of a hole and an electron through exciton absorption phenomena by receiving light; and
   confining means for confining the holes and the electrons to potential wells formed in said quantum well super-lattice structure wherein said quantum well super-lattice structure is formed of at least one direct transition semiconductor and at least one indirect transition semiconductor and wherein band gap structures of said direct transition semiconductor and said indirect transition semiconductor are provided such that holes and electrons generated through exciton absorption phenomena are confined to potential wells formed in said quantum well super-lattice structure whereby information can be recorded.

31. A semiconductor optical device according to claim 30, further comprising means for applying light to said quantum well super-lattice structure and means for applying a forward electric field to said quantum well super-lattice structure to record information.

32. A semiconductor optical device according to claim 31, further comprising means for applying a reverse electric field to said quantum well super-lattice structure to eras recorded information.

33. A semiconductor optical device according to claim 26, further comprising:
   means for applying light to said quantum well super-lattice structure to record information;
   second means for applying light to said quantum well super-lattice structure to read said information; and
   photo-sensing means for reading said recorded information by using said light applied by said second means.

* * * * *